US011285921B2

(12) United States Patent
Trebouet et al.

(10) Patent No.: US 11,285,921 B2
(45) Date of Patent: Mar. 29, 2022

(54) DEVICE FOR PROTECTING AN OPTICAL SENSOR OF A DRIVING ASSISTANCE SYSTEM FOR A MOTOR VEHICLE

(71) Applicant: Valeo Systèmes d'Essuyage, Le Mesnil Saint Denis (FR)

(72) Inventors: Marcel Trebouet, Le Mesnil Saint Denis (FR); Frédéric Bretagnol, Issoire (FR)

(73) Assignee: Valeo Systèmes d'Essuyage, Le Mesnil Saint Denis (FR)

( * ) Notice: Subject to any disclaimer, the term of this patent is extended or adjusted under 35 U.S.C. 154(b) by 284 days.

(21) Appl. No.: 16/585,884

(22) Filed: Sep. 27, 2019

(65) Prior Publication Data

US 2020/0101945 A1    Apr. 2, 2020

(30) Foreign Application Priority Data

Sep. 27, 2018  (FR) ...................................... 1858843

(51) Int. Cl.
*B60R 11/04* (2006.01)
*B60S 1/56* (2006.01)
(Continued)

(52) U.S. Cl.
CPC ............... *B60S 1/56* (2013.01); *G03B 17/08* (2013.01); *H04N 5/2252* (2013.01);
(Continued)

(58) Field of Classification Search
CPC ...................................................... B60R 11/04
See application file for complete search history.

(56) References Cited

U.S. PATENT DOCUMENTS 7,965,336 B2 * 6/2011 Bingle .................. H04N 5/374
348/374
2006/0038668 A1 * 2/2006 DeWard ................. B60R 11/04
340/438

(Continued)

FOREIGN PATENT DOCUMENTS

EP        3045969 A1    7/2016
WO     2016/045955 A1   3/2016
WO     2018/091641 A1   5/2018

OTHER PUBLICATIONS

Preliminary Search Report and Written Opinion issued in corresponding French Patent Application No. 1858843, dated May 27, 2019 (6 pages).

*Primary Examiner* — Hung V Ngo
(74) *Attorney, Agent, or Firm* — Osha Bergman Watanabe & Burton LLP

(57) ABSTRACT

A device for protecting an optical sensor of a driver assistance system for a motor vehicle includes a protective casing, a motor, and a pressure balancing system. The protective device has a movable part and a fixed part. The protective casing forms a cavity that accommodates an optical sensor that includes an optical surface. Additionally, the protective casing freely rotates about an axis and includes an optical element that faces the optical surface of the optical sensor. The motor rotates the protective casing at speeds allowing the optical element to be cleaned by a centrifugal effect. The pressure balancing system includes an air vent orifice allowing fluid communication between the inside and the outside of the protective device. The air vent orifice is produced in the fixed part of the protective device.

10 Claims, 2 Drawing Sheets

Figure 1:
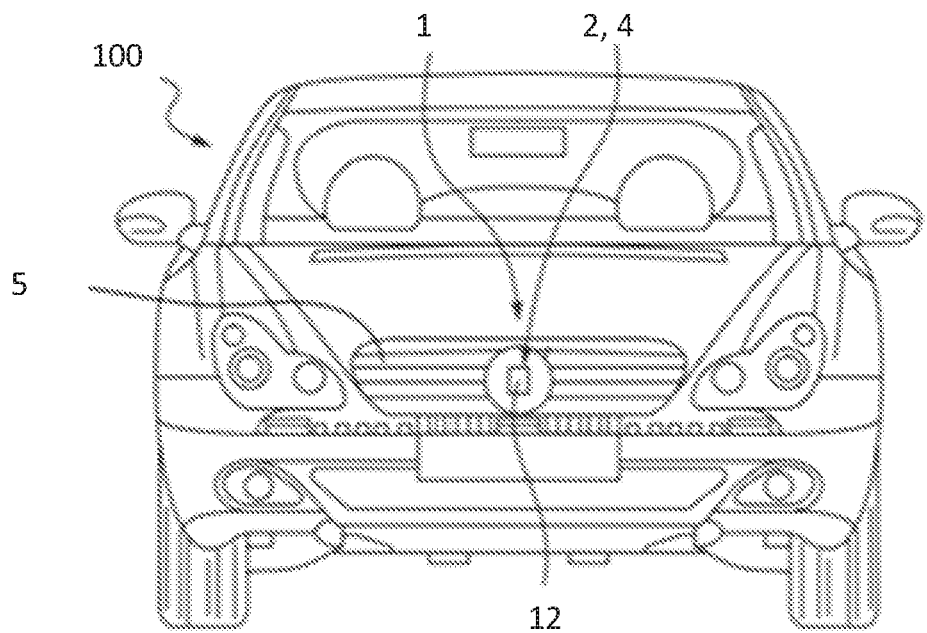

(51) Int. Cl.
*G03B 17/08* (2021.01)
*H04N 5/225* (2006.01)
*H05K 5/02* (2006.01)

(52) U.S. Cl.
CPC ......... *H05K 5/0213* (2013.01); *H05K 5/0217* (2013.01); *H05K 5/0247* (2013.01); *B60R 11/04* (2013.01)

(56) References Cited

U.S. PATENT DOCUMENTS

| | | | | |
|---|---|---|---|---|
| 2014/0036132 | A1* | 2/2014 | Pawlowski | G02B 27/0006 348/335 |
| 2015/0256729 | A1* | 9/2015 | Wato | G03B 17/02 348/311 |
| 2016/0304029 | A1* | 10/2016 | Villanueva | H04N 5/2257 |
| 2018/0335622 | A1* | 11/2018 | Trebouet | G02B 27/0006 |
| 2019/0061640 | A1* | 2/2019 | Jefferson | B60H 1/00821 |
| 2019/0241130 | A1* | 8/2019 | Wietkamp | B60R 11/04 |
| 2019/0329737 | A1* | 10/2019 | Bretagnol | G02B 5/208 |
| 2020/0254979 | A1* | 8/2020 | Bretagnol | B60S 1/0848 |
| 2021/0188261 | A1* | 6/2021 | Song | B60W 40/105 |
| 2021/0197733 | A1* | 7/2021 | Percival | G03B 17/02 |
| 2021/0213881 | A1* | 7/2021 | Hoyda | B60R 1/12 |

* cited by examiner

DEVICE FOR PROTECTING AN OPTICAL SENSOR OF A DRIVING ASSISTANCE SYSTEM FOR A MOTOR VEHICLE

The present invention relates to the field of driver assistance and in particular to the driver assistance systems that are installed on some vehicles, with the driver assistance system being able to comprise an optical sensor, such as a camera comprising an objective, for example. More specifically, the invention relates to a casing for protecting such an optical sensor.

Currently, optical sensors and, for example, front, rear or even side view cameras, equip a large number of motor vehicles. They particularly form part of driver assistance systems, such as parking assistance systems or even lane departure detection systems. In order to optimally detect the obstacles that are located all around the vehicle, it is known for the optical sensors of driver assistance systems to be installed on the periphery of the vehicles at different points depending on the desired use, for example, integrated in the rear or front bumpers, in the side strengthening panels or in the vicinity of the rear or front registration plate of the vehicle.

The optical sensors in this case are highly exposed to projections of mineral or organic dirt that can be deposited on the corresponding optical surface and thus reduce the effectiveness of image capturing or of the detection of information, and even render the relevant sensor, detector or camera completely inoperative. Particularly in the event of rain, it has been seen that projections of rain and of dirt can significantly affect the operability of the driver assistance system comprising such an optical sensor.

Consequently, it is understood that the optical surfaces of the sensors must be cleaned so that their correct operating condition can be guaranteed, and this requirement is even more important in the case of an autonomous vehicle, in which the vehicle is controlled by means of information that is gathered by the cameras.

It is thus known for a device for cleaning the optic of the sensor to be arranged in the vicinity of this optic in order to remove the polluting elements that are deposited thereon beforehand. In particular, the cleaning devices can involve jets supplied with cleaning fluid. If necessary, these jets can be arranged at the end of a telescopic device that is configured to transition from a stowed rest position to a deployed cleaning position. While the use of these jets enables suitable cleaning of the sensors, it generates significant operating costs since fairly high quantities of cleaning fluid and sophisticated jet kinematic means need to be provided.

Alternatively, it is known for cleaning devices to be provided that comprise, on the one hand, a protective glass, arranged facing the optical surface of the sensor so that any dirt is deposited on this glass and not directly on the optical surface and, on the other hand, vibration means, which are controlled in order to cause the protective glass to vibrate so as to remove any dirt. However, it has been seen that the effectiveness of such a device for stubborn and encrusted dirt can be limited despite the vibration of the protective glass.

Another alternative makes provision for a sensor, and more specifically a camera, of a driver assistance system to be connected to a protective device that comprises a protective casing housing the camera, while protecting it from the external environment. The protective casing comprises a transparent, optical element arranged opposite the objective of the camera to enable image capturing. The protective casing and the associated optical element are rotated by means of a motor forming part of the protective device.

More specifically, the motor is configured to rotate the protective casing at a speed that is sufficient for removing dirt or water that can be present on the optical element by a centrifugal effect. This solution for cleaning by a centrifugal effect is far more effective than causing the optical element to vibrate, as described above.

Such a cleaning system operating by a centrifugal effect, i.e. comprising a casing rotating about the camera, entails difficulties in terms of sealing the cavity in which the camera extends, both with respect to air and humidity. Furthermore, operating the camera inside the rotary casing increases the temperature, and therefore modifies the pressure, in the cavity housing this camera, thus increasing the circulation of air, and the ingress of humidity, inside the protective casing. This can result in the appearance of internal condensation both on the lens and on the internal face of the optical element constrained to rotate with the protective casing, which can disrupt the acquisition of data by the sensor and by the camera, for example.

In order to limit a condensation phenomenon in the optical element, it is known for orifices to be produced through a wall of the casing. Each orifice allows communication, and the passage of an air flow, between the inside and the outside of the casing. In order to prevent humidity from being introduced into the protective casing, each orifice is covered by a semi-permeable membrane, i.e. permeable to air but impermeable to water. This solution thus enables good ventilation between the camera and the optical element in order to prevent condensation from accumulating on the optical element. However, this solution has the disadvantage of having to perforate the casing and therefore modify the balance of its mass. Another disadvantage relates to the fact that the membranes subjected to the centrifugal force tend to deteriorate, to deform or, worse, to detach from the casing, exacerbating this unbalancing phenomenon. The centre of gravity of the casing is then offset relative to the axis of rotation of the motor. This offset causes asymmetric stresses on the shaft of the motor when it is rotated, generating hiss or, even worse, irreversible deformation of its shaft.

The present invention proposes to overcome this technical problem by presenting an alternative to the known devices for protecting an optical sensor, allowing a condensation phenomenon inside the protective device to be prevented or at the very least limited, whilst maintaining its balance when it is rotated.

To this end, the aim of the invention is a device for protecting an optical sensor of a driver assistance system for a motor vehicle, the protective device comprising, on the one hand, a protective casing forming a cavity able to at least partly accommodate the optical sensor comprising an optical surface, the protective casing comprising an optical element configured to be disposed facing the optical surface of the optical sensor, the protective casing being configured to freely rotate about an axis and comprising, on the other hand, a motor configured to rotate the protective casing at speeds allowing the optical element to be cleaned by a centrifugal effect, the protective device being configured so as to have a movable part and a fixed part.

The invention is notable in that the protective device comprises a pressure balancing system comprising an air vent orifice allowing fluid communication between the inside and the outside of the protective device, the air vent orifice being produced in the fixed part of the protective device.

The air vent orifice allows the air present in the casing to be renewed and particularly allows the air to be discharged so as to prevent the formation of condensation in the optic of the optical sensor and/or in the optical element of the casing. Furthermore, advantageously, the invention proposes renewing the air present in the casing by locating the air vent orifice in a separate fixed part of the casing, so that no opening is made in the rotary casing. In this way, the balance of the mass of the casing is maintained and no stress is exerted on the actuator when said actuator rotates the casing. According to another advantage, the invention also allows a phenomenon of condensation accumulation inside the first sub-assembly to be prevented.

According to one aspect, the protective device is a separate element of the optical element.

According to one alternative, the protective device forms part of the optical element.

According to various features of the invention, taken separately or in combination, the following can be provided:
- the pressure balancing system comprises means for circulating an air flow between, on the one hand, the cavity formed by the protective casing forming part of the movable part of the protective device and, on the other hand, the air vent orifice produced in the fixed part of the protective device;
- the optical sensor is supported by a support element, at least one base of which is disposed in the cavity, the means for circulating an air flow comprising at least one air passage orifice produced in the thickness of the base of the support element;
- the support element comprises a tubular body extending the base, said tubular body being hollow in order to form an air circulation duct forming a fluid communication between the air passage orifice and the air vent orifice. The duct is thus such that it extends between a first end emerging inside the casing and a second end emerging in a gap, in which one or more air vent orifices are arranged;
- the tubular body is configured to act as a guide for a bundle of electrical and video connection cables, the bundle and the tubular body being designed to leave a fluid communication passage between the air passage orifice and the air vent orifice;
- an end fitting is rigidly connected to a housing of the motor, opposite the protective casing, said air vent orifice being produced in a peripheral wall of the end fitting;
- the protective device comprises a liquid deflection component positioned outside the protective device and opposite the air vent orifice;
- the air vent orifice is equipped with a semi-permeable membrane;
- the protective device comprises humidity absorption means.

The invention also relates to a motor vehicle comprising a device for protecting an optical sensor of a driver assistance system, as described above, characterized in that the air vent orifice produced in the fixed part is oriented towards the ground or substantially towards the ground when the motor vehicle is in a driving situation.

Figure 2:
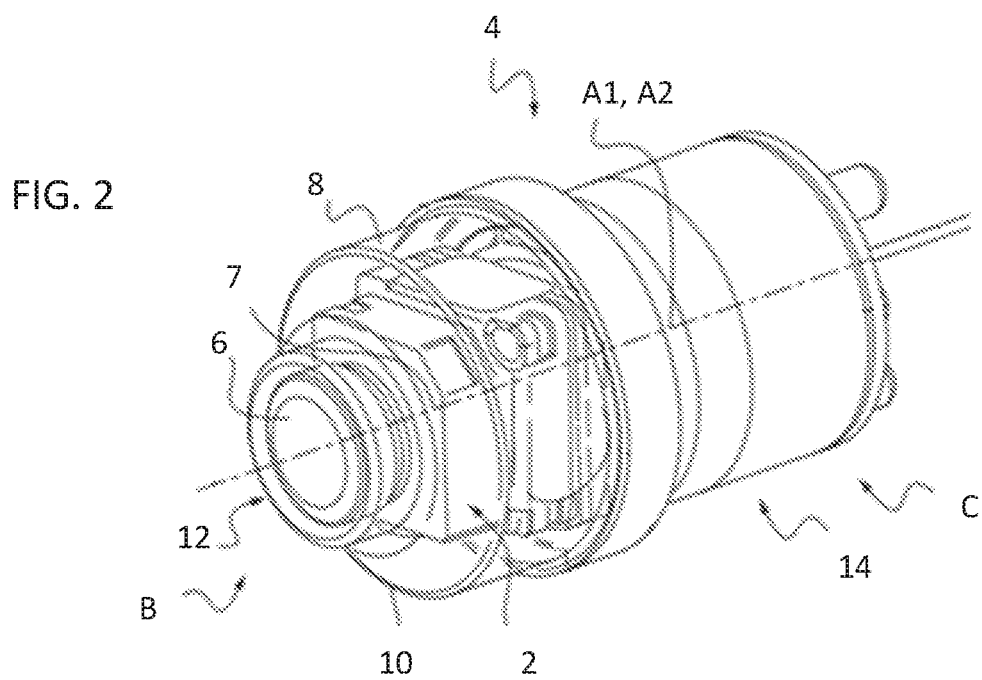
Figure 3:
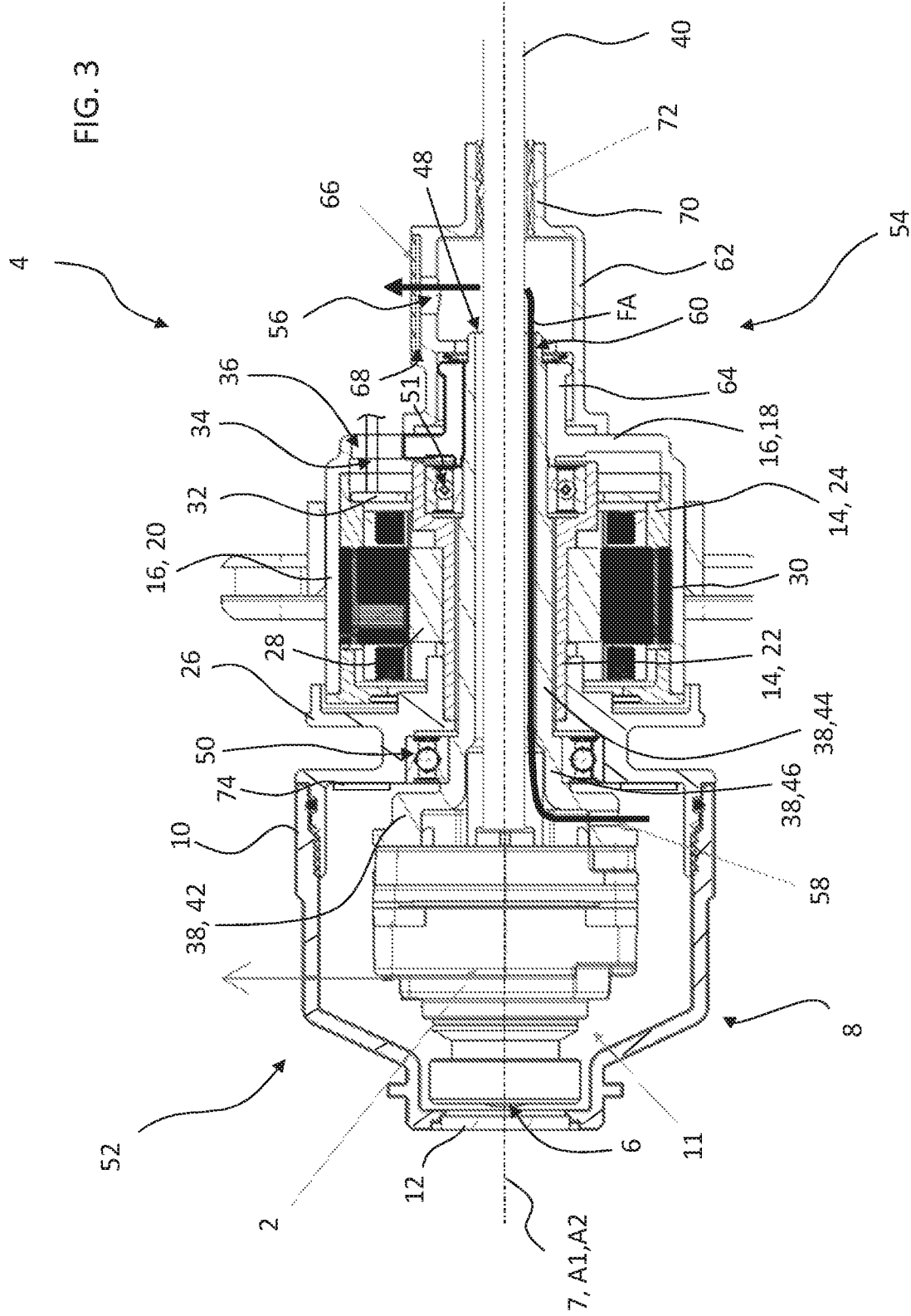

Further features and advantages of the invention will become more clearly apparent upon reading the following description, which is provided by way of a non-limiting illustrative example, and from the accompanying drawings, in which:

FIG. 1 shows a front view of a motor vehicle, comprising a driver assistance system in the vicinity of its grill;

FIG. 2 schematically shows a perspective view of a device for protecting an optical sensor of a driver assistance system;

FIG. 3 schematically shows a longitudinal section view of the protective device of FIG. 2, particularly showing a pressure balancing system for preventing or limiting the formation of humidity inside the protective device.

Firstly, it is to be noted that the figures disclose the invention in a detailed manner for implementing the invention, with said figures clearly being able to be used to better define the invention if necessary. In these figures, the identical elements use the same reference signs. The various embodiments are examples. Even though the description refers to one or more embodiments, this does not necessarily mean that each reference sign relates to the same embodiment or that the features are applicable to a single embodiment. Simple features of various embodiments can also be combined or interchanged in order to provide other embodiments.

Furthermore, it is to be noted that in the description some elements can be indexed, such as, for example, a first element or a second element. In this case, it is simple indexing for differentiating and denoting elements that are similar but not identical. This indexing does not imply a priority of one element over another and such denominations can be easily interchanged without departing from the scope of the present description.

A vehicle 100 is equipped, according to the invention, with a driver assistance system 1, which comprises at least one optical sensor 2 and a protective device 4 arranged around this optical sensor. The illustrated example more specifically shows an optical sensor 2 formed by a front view camera disposed in the grill 5 of the vehicle, but it will be understood that the following description with respect to such an optical sensor could be implemented for devices that are also, or alternatively, disposed at the rear or laterally relative to the vehicle. According to the invention, at least the protective device 4 associated with the optical sensor 2 is configured to prevent or to limit the appearance of condensation on the optical surfaces of the protective device and/or of the optical sensor.

The optical sensor 2 is, for example, an image capturing optical sensor such as a camera. It can involve a CCD (Charged Coupled Device) sensor or a CMOS sensor comprising a matrix of miniature photodiodes. According to another variant, without this list necessarily being exhaustive, it can involve a LIDAR (Light Detection and Ranging) sensor.

In FIG. 2, the protective device 4 has been shown partially transparent in order to show the optical sensor 2 housed in the protective device 4. The optical sensor 2 comprises an optical surface 6 and an optical axis 7. The optical surface 6 is, for example, a camera objective, which can comprise one or more lenses depending on the desired field of vision and resolution.

The optical sensor 2 is at least partly mounted in a protective casing 8 forming a first sub-assembly B of the protective device 4. To this end, the protective casing 8 comprises a wall 10 defining a cavity 11, in which the optical sensor is housed. This wall 10 is preferably centred around the optical axis 7 of the optical sensor 2. In the example shown, the wall 10 is of substantially cylindrical shape.

The protective casing 8 also comprises an optical element 12 formed by a transparent wall and disposed downstream of the optical surface 6 of the optical sensor 2. This optical element 12 is advantageously designed so as to cover the whole optical surface 6. In other words, the optical element 12 is arranged in the field of vision of the optical sensor 2, with the transparent wall preventing the effectiveness of the optical sensor 2 from being hindered. The optical element 12 can be produced as a single piece with the protective casing 8. Alternatively, the protective casing 8 and the optical element 12 can be two separate parts rigidly connected together. The transparent wall forming all or part of the optical element 12 can be made of glass or of a plastic material such as polycarbonate. The protective casing 8 can be produced from any suitable material that is known to a person skilled in the art, preferably from an impermeable material.

By arranging the optical element 12 downstream of the optical surface 6, it is understood that the optical element 12 is disposed between the outside of the vehicle and the optical surface 6 of the optical sensor 2, so that the optical element 12 protects the optical surface 6 against any projections of dirt or solid debris that could damage this optical surface 6. It is therefore a protective element or, more specifically, a mask for protecting the optical sensor 2, and it is this optical element 12 that is subjected to the aggressive factors that originate from outside, i.e. equally projections of water, of pollutants, of gravel and deposits of pollutants or traces of water. In order to allow the surface of the optical element 12 to be cleaned by a centrifugal effect, as described above, the protective device 4 comprises a motor 14 forming a second sub-assembly C. The motor 14 is coupled to the protective casing 8 so as to rotate the protective casing 8, and therefore the optical element 12, about an axis of rotation A1 coincident with the optical axis 7 of the optical sensor 2.

The section view of FIG. 3 more specifically shows the structure of the protective device and the means implemented to prevent or to limit the condensation that is likely to form on the optical surface of the camera or on the internal face of the optical element.

The motor 14 forming the second sub-assembly C is rotationally mounted about an axis of rotation A2 coincident with the axis of rotation A1 of the first sub-assembly B and with the optical axis 7 of the optical sensor 2.

The motor 14 comprises a housing 16, a bottom wall 18 and a peripheral wall 20 of which form a housing, inside which a rotor 22 and a stator 24 are disposed. In this case, the stator 24 is fixed on an internal face of the peripheral wall 20 of this housing 16, with the rotor 22 being free to rotate relative to the fixed stator 24.

In the embodiment shown, the motor is an internal rotor motor, with the rotor 22 rotating inside the stator 24. It will be understood that it is possible to contemplate the motor comprising an external rotor, without departing from the scope of the invention.

The protective casing 8 and the associated optical element 12 are rigidly connected to the rotor 22 of the motor 14. In the illustrated example, an intermediate connection part 26 is disposed between the rotor 22 and the protective casing 8, by being rigidly connected at each of its longitudinal ends to both of these components. Rotating the rotor 22 by means of the electrical power supply of the stator 24 allows the intermediate connection part to be rotated, which rotates the protective casing 8 and the optical element 12 to be cleaned by centrifugal force, if necessary.

The motor 14 comprises at least one magnet 28 rigidly connected to the rotor 22 and a predefined number of electromagnetic coils 30 mounted on the stator 24 and supplied with current to generate a magnetic field, in which this at least one magnet 28 is able to move. To this end, the motor 14 comprises a control circuit 32 for powering the electromagnetic coils 30. This control circuit 32 is connected to an electrical power supply harness 34, schematically shown in FIG. 3, and is connected, for example, to the general electrical circuit of the vehicle 100, by passing through an output orifice 36 arranged in the bottom wall 18 of the housing 16 of the motor 14, as shown in FIG. 3.

In the illustrated embodiment, the rotor 22 is disposed around a support element 38 rigidly connected to the optical sensor 2 and forming a sheath for a bundle of electrical and video connection cables 40.

The support element 38 comprises a base 42 rigidly connected to the rear part of the camera and a tubular body 44 disposed in the longitudinal extension of the base 42 and inside which the bundle of electrical and video connection cables 40 circulates.

It is understood that the rear part of the camera corresponds to the part that is rotated opposite the optic of the camera, towards the inside of the protective casing 8.

In the example shown, the support element 38 comprises an intermediate bearing 46, the diameter of which enables continuity between the base 42, which has a diameter that is substantially equal to a corresponding dimension of the camera, and the tubular body 44, which has a diameter that is marginally greater than that of the bundle of electrical and video connection cables 40.

The tubular body 44 comprises a free end 48, i.e. the end opposite the base 42, that is open so that the bundle of electrical and video connection cables 40 extends beyond this free end of the tubular body 44.

The rotor 22 is disposed around the outer face of the tubular body 44 of the support element, so that the support element acts as a means for rotationally guiding the rotor.

The protective device 4, and more specifically on the second sub-assembly C, comprises two roller bearings 50, 51 for providing suitable pivoting of a movable part 52 of the protective device, particularly formed by the rotor 22 of the motor, the protective casing 8 and the optical element 12, relative to a fixed part 54 of the protective device 4, particularly formed by the stator 24 of the motor 14.

More specifically, with reference to the example shown in FIG. 3, the two roller bearings are disposed so that one is between the support element 38 rigidly connected to the optical sensor and the intermediate part 26 and the other one is between this same support element 38 rigidly connected to the optical sensor and the rotor 22. It will be understood that this arrangement is only a non-limiting example and that the number and the position of the roller bearings could vary as long as this allows the movable part 52 to rotate relative to the fixed part 54 of the protective device.

According to the invention, the protective device 4 comprises a pressure balancing system configured to prevent, or to at least limit, condensation on the transparent wall forming the optical element 12 rigidly connected to this protective casing 8, and the pressure balancing system is specific in that it comprises an air vent orifice 56, allowing fluid communication between the outside and the inside of the protective device, which is produced in the fixed part 54 of the protective device 4. As will be described hereafter, the pressure balancing system can further comprise fluid communication means allowing an air flow to be guided between this air vent orifice and the cavity 11 formed by the protective casing 8 and inside which the optical sensor is housed.

The pressure balancing system in this case further comprises an air passage orifice 58 and a circulation duct 60. The air passage duct is produced in the base 42 of the support element 38 to allow an air flow FA, shown by an arrow in FIG. 3, to circulate from the cavity 11, in which the base 42 of the support element 38 extends, to the air vent orifice 56 produced in a fixed wall, particularly by means of the circulation duct 60 arranged along the tubular body 44 of the support element and inside said element, with the air flow passing through the open free end 48 of the tubular body 44 of the support element. In this way, the resulting rotation of the protective casing and increase in temperature is compensated by discharging hot air, via the air flow FA path, towards the outside of the protective device, so as to prevent or to limit condensation from appearing on the optical surfaces rotated towards the inside of the cavity 11 formed by the protective casing 8.

By way of a non-limiting example, the air passage orifice 58 produced through the thickness of the support element 38 has a passage section between 1.5 mm and 4 mm, and the air vent orifice 56 has a passage section between 1.5 mm and 4 mm. The passage sections of the air passage orifice 58 and of the air vent orifice 56 are proportional to the volume of the camera.

The passage sections of the air passage orifice 58 and of the air vent orifice 56 can be square, rectangular or even circular.

Preferably, the size of the passage section of the air vent orifice 56 is substantially equal to that of the air passage orifice 58.

It is to be noted that both the air passage orifice 58 and the air vent orifice 56 are produced in fixed structural elements, namely, respectively, in the fixed support element 38 and in a fixed part rigidly connected to the stator 24, so that no imbalance is created when rotating the protective casing.

The air vent orifice 56 can be formed in the housing 16 of the motor 14 as long as the circulation duct 60, in this case produced along the tubular body 44 of the support element 38, allows air to flow up to this air vent orifice 56.

In the example shown in FIG. 3, the air vent orifice 56 is produced in an end fitting 62 disposed against the outer face of the bottom wall 18 of the motor housing and forming a sealing means around the support element 38 projecting from this bottom wall 18.

More specifically, the end fitting 62 can be disposed around a sleeve 64 forming a projection from the bottom wall 18 and in this way forming a guide for the support element 38 of the camera.

The air vent orifice 56 is equipped with a semi-permeable membrane 66, i.e. a membrane that is both permeable to air and impermeable to liquids, and in particular to water. In particular, the membrane can be hydrophobic and, if necessary, oleophobic, by having a microporous coating.

The semi-permeable membrane 66 is associated with the air vent orifice 56 in a sealed manner, by bonding or even by ultrasonic soldering. As shown in FIG. 3, to this end the membrane 66 particularly can be disposed in a counterbore 68 arranged in the extension of the air vent orifice and being bigger than this orifice, in order to allow soldering or bonding on the periphery of the membrane 66.

The end fitting 62 is hermetically held, by known means, against the bottom wall 18 of the housing 16 of the motor 14. The end fitting 62 has a hollow cylindrical shape forming a gap, in which the free end 48 of the tubular body of the support element 38 emerges. The air vent orifice 56 is formed in a peripheral wall of the end fitting 62 and a sheath 70 is disposed in the axial extension of the sleeve 64 projecting from the wall of the end fitting disposed opposite this sleeve, with the sheath 70 allowing the bundle of electrical and video cables to pass through the end fitting 62 in order to be connected to suitable control means. Advantageously, the sheath 70 is equipped with a sealing element 72, produced from a resilient or substantially resilient material, so as to sealably surround the bundle of electrical and video connection cables 40, whilst allowing it to be curved to facilitate its connection outside the protective device.

This embodiment advantageously allows separation of the passage for the bundle of electrical and video connection cables 40 formed by the sheath 70 and of the air vent orifice 56 for the air flow FA. Thus, it is possible to ensure, when assembling the protective device 4 and the associated optical sensor 2 in the motor vehicle, that the air vent orifice 56 is oriented towards the ground, for example. In FIG. 3, the air vent orifice 56 and the semi-permeable membrane 66 disposed through this orifice are shown rotated upwards, but it is to be noted that in practice they preferably will be oriented downwards, or at least inclined, in order to limit, for example, dirt or liquid from accumulating on the surface of the membrane, the effect of which would be to limit the passage of air.

In this context, in a variant that is not shown, provision can be made for the wall of the end fitting, in which the air vent orifice is formed, to be equipped with a liquid deflection component, positioned outside the protective device and opposite the air vent orifice. This variant is particularly advantageous when the air vent orifice 56 has to be oriented upwards when the protective device 4 is mounted in a motor vehicle 100, with the deflection component preventing dirt or a liquid from being able to block the passage of air through the membrane. Of course, the deflection component will be maintained at a sufficient distance from the air vent orifice to allow an air flow to circulate between the inside and the outside of the protective device.

The protective device can additionally comprise humidity absorption means 74, particularly formed by a specific absorbent material, such as magnesium carbonate, and, for example, upsalite, or any other equivalent porous material. These humidity absorption means 74 can be disposed on an internal face of the casing defining the cavity in which the camera extends, or even along the internal face of the tubular body 44 of the support element 38.

The presence of these humidity absorption means 74 can obviate the need for the semi-permeable membrane, the previously described function of which is to prevent humidity from entering the protective device. This presence in any case can allow a membrane with less effective hydrophobic capabilities, and therefore a less expensive membrane, to be provided.

The invention, as it has been described, effectively meets its stated aims and allows, through simple means, a protective device to be produced that comprises means for preventing or limiting condensation on the optical elements associated with the rotating protective casing.

It is to be noted that a protective device according to the invention differs from a protective device of the prior art in that the protective casing 8 does not comprise orifices in the wall 10, and therefore in that the rotating part does not have orifices on the periphery that could adversely affect the rotation of this rotating part. Thus, the balance of the mass of the protective casing is maintained.

It is to be noted that the various variants of a protective device according to the invention that are described above can be combined together so as to form a new embodiment that is not described.

The invention claimed is:

1. A device for protecting an optical sensor of a driver assistance system for a motor vehicle comprising:
   a protective casing forming a cavity able to at least partly accommodate the optical sensor comprising an optical surface, the protective casing comprising an optical element configured to be disposed facing the optical surface of the optical sensor, the protective casing being configured to freely rotate about an axis;

a motor configured to rotate the protective casing at speeds allowing the optical element to be cleaned by a centrifugal effect, the protective device being configured so as to have a movable part and a fixed part; and a pressure balancing system comprising an air vent orifice allowing fluid communication between the inside and the outside of the protective device, the air vent orifice being produced in the fixed part of the protective device.

2. The protective device according to claim 1, wherein the pressure balancing system comprises means for circulating an air flow between the cavity formed by the protective casing forming part of the movable part of the protective device.

3. The protective device according to claim 2, wherein the optical sensor is supported by a support element, at least one base of which is disposed in the cavity, the means for circulating an air flow comprising at least one air passage orifice produced in the thickness of the base of the support element.

4. The protective device according to claim 3, wherein the support element comprises a tubular body extending the base, said tubular body being hollow in order to form an air circulation duct forming a fluid communication between the air passage orifice and the air vent orifice.

5. The protective device according to claim 4, wherein the tubular body is configured to act as a guide for a bundle of electrical and video connection cables, the bundle and the tubular body being designed to leave a fluid communication passage between the air passage orifice and the air vent orifice.

6. The protective device according to claim 1, wherein an end fitting is rigidly connected to a housing of the motor, opposite the protective casing, said air vent orifice being produced in a peripheral wall of the end fitting.

7. The protective device according to claim 1, further comprising a liquid deflection component positioned outside the protective device and opposite the air vent orifice.

8. The protective device according to claim 1, wherein the air vent orifice is equipped with a semi-permeable membrane.

9. The protective device according to claim 1, further comprising humidity absorption means.

10. A motor vehicle comprising:

a device for protecting an optical sensor of a driver assistance system according to claim 1, wherein the air vent orifice produced in the fixed part is oriented towards the ground or substantially towards the ground when the motor vehicle is in a driving situation.

* * * * *